US005612258A

United States Patent [19]
Tanaka

[11] Patent Number: 5,612,258
[45] Date of Patent: Mar. 18, 1997

[54] METHOD OF PRODUCING A SEMICONDUCTOR LASER DEVICE

[75] Inventor: Haruo Tanaka, Kyoto, Japan

[73] Assignee: Rohm Co., Ltd., Kyoto, Japan

[21] Appl. No.: 495,100

[22] Filed: Jun. 27, 1995

[30] Foreign Application Priority Data

Jun. 29, 1994 [JP] Japan .................................. 6-146887

[51] Int. Cl.$^6$ .................................................. H01L 21/60
[52] U.S. Cl. ......................... 437/209; 437/124; 437/133; 437/906
[58] Field of Search ...................... 437/124, 130, 437/133, 209, 906

[56] References Cited

U.S. PATENT DOCUMENTS 4,985,370  1/1991  Ponjee et al. .......................... 437/129
5,024,966  6/1991  Dietrich et al. ......................... 437/906
5,049,527  9/1991  Merrick et al. ......................... 437/906
5,324,387  6/1994  Andrews et al. ....................... 437/906

FOREIGN PATENT DOCUMENTS 3-173483  7/1991  Japan ..................................... 437/906
6-120565  4/1994  Japan ..................................... 437/906

*Primary Examiner*—Kevin Picardat
*Attorney, Agent, or Firm*—Brumbaugh, Graves Donohue & Raymond

[57] ABSTRACT

A semiconductor laser chip is fixed to a die bonding portion of a submount, an electrode of the semiconductor laser chip is connected to a wire bonding portion of the submount by a wire, and a coating film is formed on a light emitting end surface of the semiconductor laser chip under the state where a surface electrode of the submount is covered by a heat resistant tape.

5 Claims, 3 Drawing Sheets

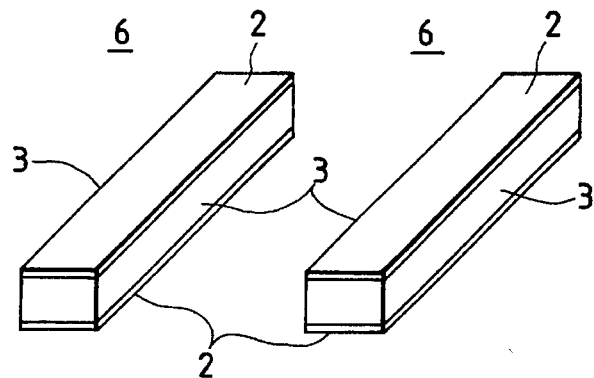
FIG. 5(a) PRIOR ART
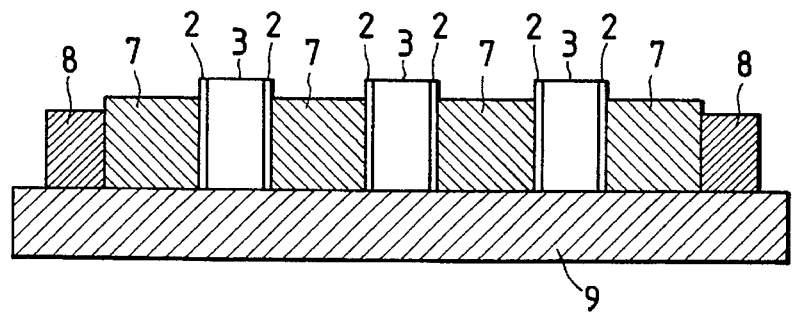
FIG. 5(b) PRIOR ART
FIG. 6
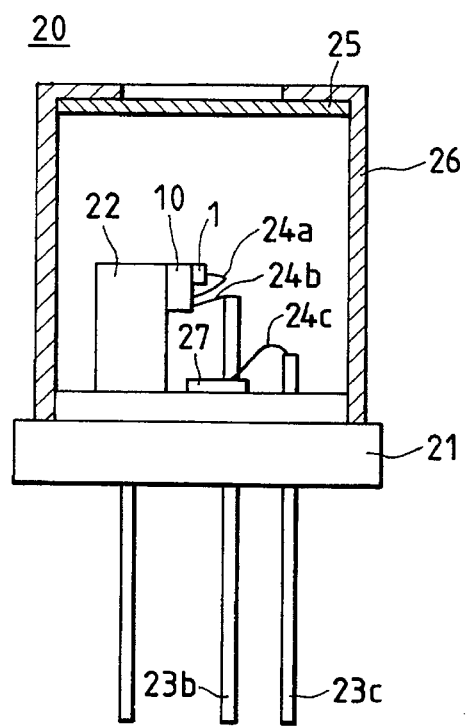

METHOD OF PRODUCING A SEMICONDUCTOR LASER DEVICE

BACKGROUND OF THE INVENTION

1. Field of the Invention

The invention relates to a method of producing a semiconductor laser device.

2. Description of the Related Art

In general, for a semiconductor laser chip (hereinafter, referred to merely as "laser chip") 1, as shown in FIG. 4, a current of a predetermined level is injected into the active layer inside the laser chip 1 via electrodes 2 formed on the front and back surfaces of the laser chip, so that laser light 4 is oscillated through light emitting end surfaces 3 formed on the both ends of the laser chip 1 by a cleavage process. In order to protect the light emitting end surfaces 3 and adjust the reflectivities of the light emitting end surfaces 3 for realizing the laser oscillation, coating films 5 which are made of alumina ($Al_2O_3$), silicon oxide ($SiO_2$), silicon nitride (SIN), or the like are formed on the laser chip 1.

As a method of forming the coating films 5 on the laser chip 1, conventionally, known is a method shown in FIGS. 5(a) and 5(b). As shown in FIG. 5(a), electrodes 2 are disposed on a wafer in which several tens to several hundreds of laser elements are formed, and the wafer is then cleft so as to form laser bars 6 in which a plurality of laser elements are laterally aligned in a line. As shown in FIG. 5(b), thereafter, the laser bars 6 are fixed to a support platform 9 under the state where they are arranged by using alignment jigs 7 in such a manner that the light emitting end surfaces 3 are positioned at the upper and lower sides, and the ends of the laser element group are clamped and held by fixing jigs 8. A process of sputtering or evaporation is then performed from the above to form the coating film 5 on each of the light emitting end surfaces 3 of each laser bar 6.

After the formation of the coating films 5, each laser bar 6 is split into separate laser chips 1. Each laser chip 1 is fixed to a submount 10 by soldering or the like, as shown in FIG. 6. The submount 10 on which the laser chip 1 is mounted is fixed to a heat sink 22 projecting upward from a stem 21. The electrode on the upper surface of the laser chip 1 is electrically connected to the submount 10 by a wire 24a. Similarly, a surface electrode of the submount 10 is electrically connected to a terminal pin 23b by a wire 24b. A photodiode 27 is disposed in order to monitor laser light emitted from the laser chip 1, and the electrode of the photodiode 27 is electrically connected to a terminal pin 23c by a wire 24c. Finally, the stem 21 is sealed by a cap 26 having a glass plate 25, thereby completing a laser unit 20.

However, the conventional method of forming the coating films 5 has the following problems. When the laser bars 6 are clamped by the alignment jigs 7, the light emitting end surfaces 3 may project from the alignment jigs 7 by a larger distance. In such a case, the coating films 5 are elongated so as to be formed also on the electrodes 2, resulting in that the heat radiation property of the laser chip 1 is impaired, and that the process of fixing the laser chip onto the submount 10 and the wire bonding process are obstructed. In the case where the light emitting end surfaces 3 project from the alignment jigs 7 by a smaller distance, conversely, there arises another problem in that the resulting coating films 5 cannot have a sufficient thickness.

Compound semiconductor materials constituting such a laser element are softer than usual semiconductor materials containing Si. Therefore, the clamping pressure exerted by the fixing jigs 8 cannot be increased to a value higher than a given level. As a result, gaps are formed between the laser bars 6 and the alignment jigs 7. The coating films reach the electrodes 2 through the gaps to be formed thereon, thereby raising the same problem as that discussed above.

Since the laser bars 6 have a very small width, they must be handled with extra care. This raises a further problem in that mass production of such laser devices requires much labor.

SUMMARY OF THE INVENTION

It is an object of the invention to provide a method of producing a semiconductor laser device which can solve the above-discussed problems.

In order to attain the object, the invention provides a method of producing a semiconductor laser device, including the steps of: fixing a semiconductor laser chip to a die bonding portion of a submount; connecting an electrode of the semiconductor laser chip to a wire bonding portion of the submount with a conductor; and forming a coating film on a light emitting end surface of the semiconductor laser chip.

BRIEF DESCRIPTION OF THE DRAWINGS

FIGS. 5(a) and 5(b) are explanatory views illustrating a conventional method of forming coating films; and FIG. 6 is a section view showing a laser unit.

DETAILED DESCRIPTION OF THE PREFERRED EMBODIMENT

Figure 1:
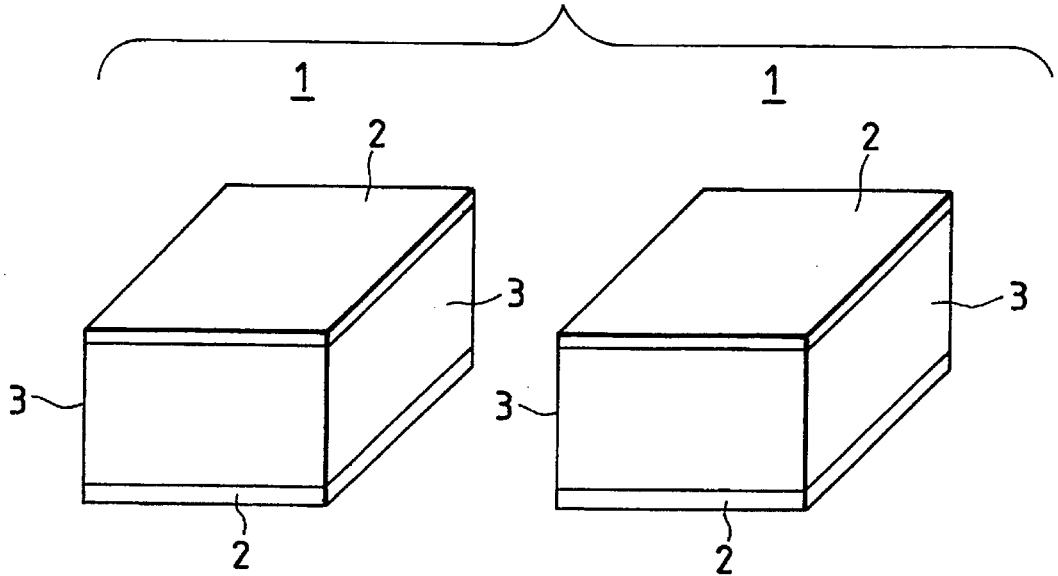
FIG. 1 is a perspective view for explaining an embodiment of the production method of the invention and showing a state where a wafer is split into laser chips.

Hereinafter, an embodiment of the invention will be described with reference to FIGS. 1 to 3. In the figures, the components identical with or corresponding to those used in the conventional example are designated by the same reference numerals.

First, electrodes 2 made of an alloy containing Au are integrally formed on the front and back surfaces of a wafer which is made of InP, GaAs, or the like and in which several tens to several hundreds of laser elements are formed, by using an adequate technique such as the MBE technique or the MOCVD technique. The wafer is cleft along the crystal orientation so as to be split into separate laser chips 1 as shown in FIG. 1.

Figure 2:
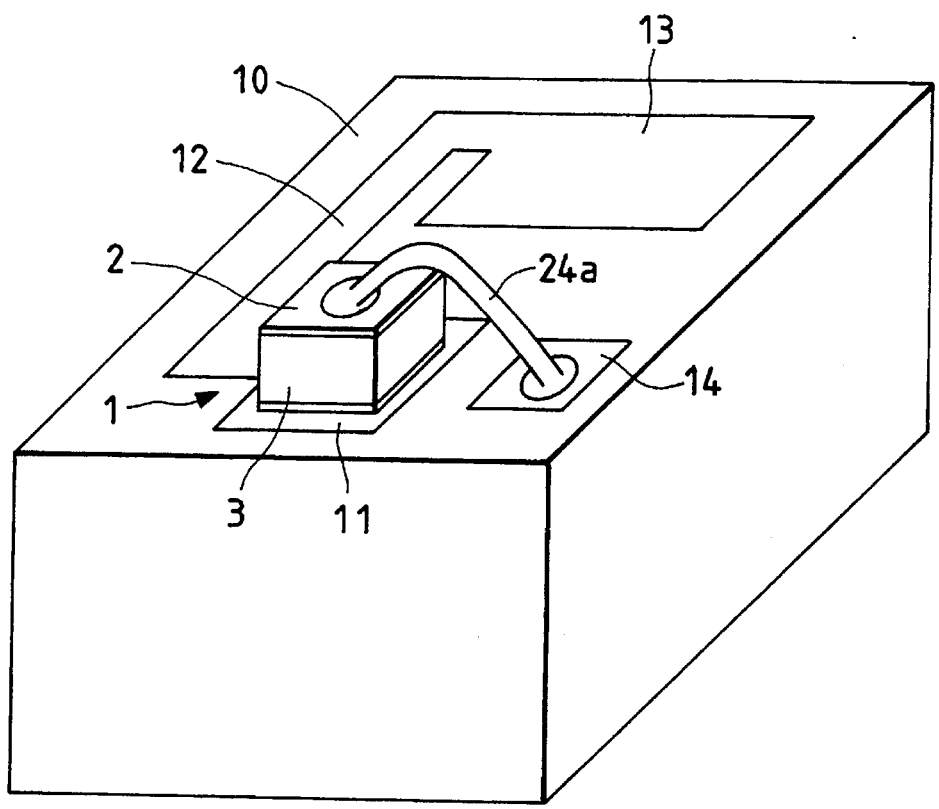
FIG. 2 is a perspective view showing a submount used in the invention.

As shown in FIG. 2, each of the separated laser chips 1 is then fixed to a die bonding portion 11 of a submount 10 made of Si, by soldering or the like. The electrode 2 of the upper surface of the laser chip 1 is electrically connected to a wire bonding portion 14 by a wire 24a.

Next, the submount 10 which is used in the invention will be described. Usually, the submount 10 is made of Si, and employed to mount the laser chip 1 thereon in order to facilitate the property test and handling. The die bonding portion 11 on which the laser chip 1 is to be mounted is formed on the surface of the submount 10. The die bonding portion 11 is electrically connected to a surface electrode 13 through an aluminum conductor 12. In order to supply a driving voltage to the laser chip 1, in the same manner as the conventional example, the surface electrode 13 is electrically connected to a terminal pin 23b by a wire 24b in the step of assembling a laser unit 20 shown in FIG. 6.

Figure 3:
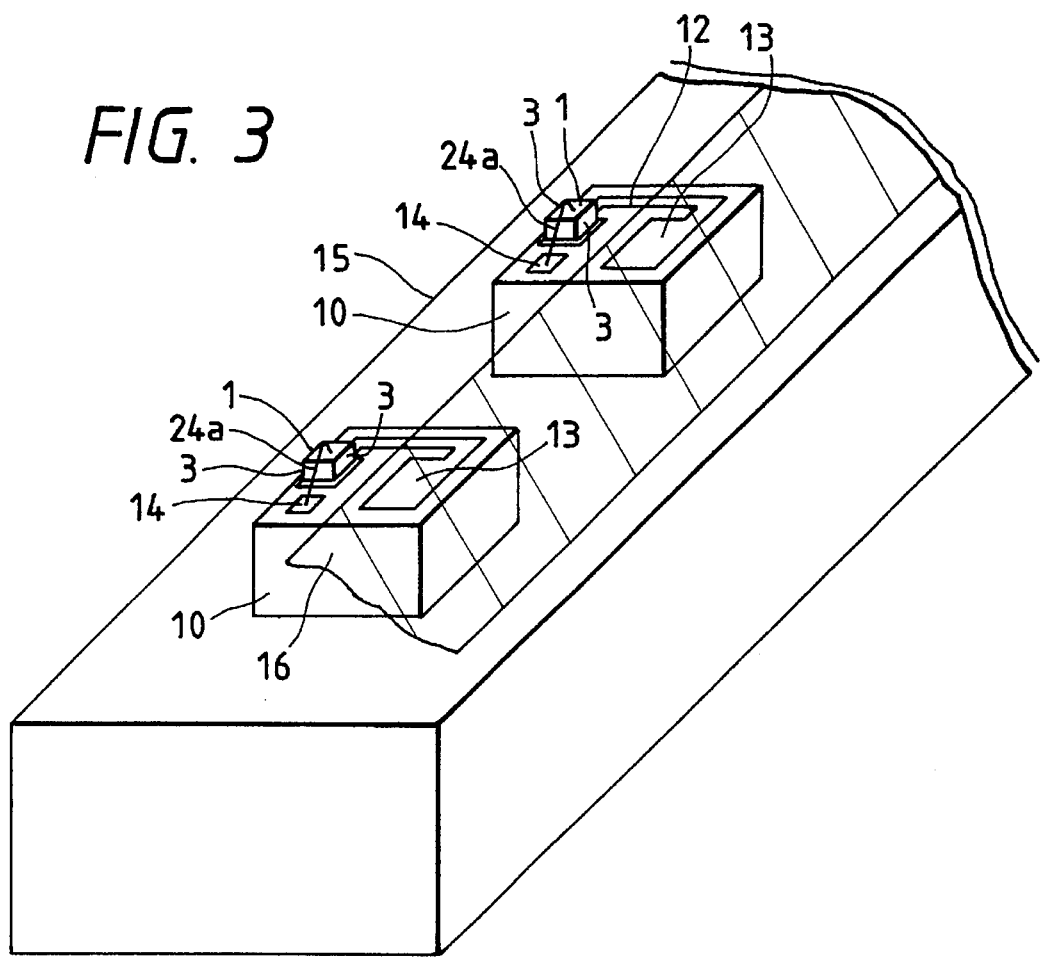
FIG. 3 is a perspective view showing a state of executing the production method of the invention.
Figure 4:
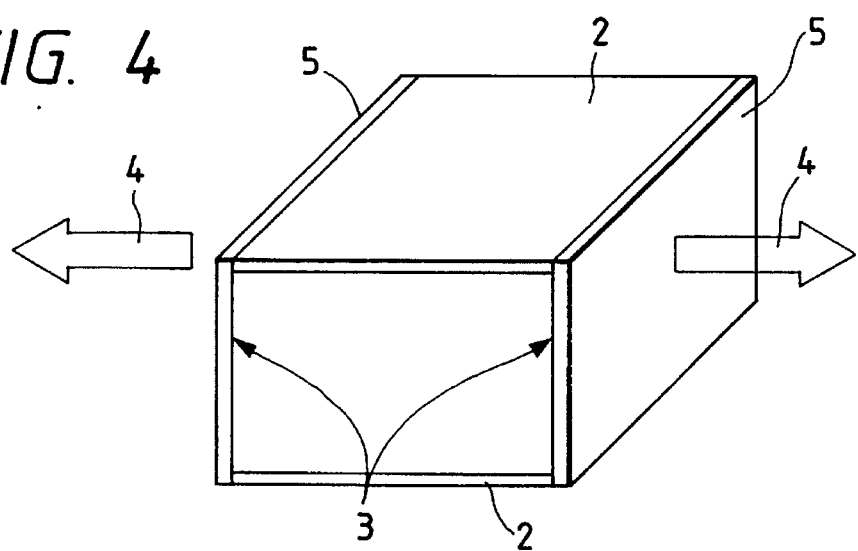
FIG. 4 is a perspective view showing a laser chip on which coating films are formed.

A plurality of submounts 10 on each of which the laser chip 1 is mounted and the electrode 2 of the upper surface of the laser chip 1 is wire-bonded to the wire bonding portion 14 are arranged on a metal carrier 15 as shown in FIG. 3, in such a manner that their surface electrodes 13 are aligned in a line. Thereafter, a heat resistant tape 16 such as a polyimide tape or a silicon tape is applied to the submounts 10 so as to cover the aligned surface electrodes 13 of the submounts. In the next sputtering step wherein coating films 5 are formed on the light emitting end surfaces 3, the heat resistant tape 16 functions to prevent the coating films 5 from adhering to the surface electrodes 13. The application of the heat resistant tape is conducted because, when the coating films 5 adhere to the surface electrodes 13, a faulty wire bonding may be caused. Consequently, the heat resistant tape 16 is required only to cover the surface electrodes 13 and not to cover the whole of each submount 10.

The carrier 15 on which the heat resistant tape 16 is applied to the submounts 10 is placed in a sputtering apparatus or an evaporation apparatus, and the light emitting end surfaces 3 are coated by alumina ($Al_2O_3$), silicon oxide ($SiO_2$), or silicon nitride (SIN). In this process, the coating films 5 are adhered to portions of the submount 10 other than the surface electrodes 13, in addition to the light emitting end surfaces 3. However, this adherence to the other portions does not raise a serious problem.

After the process of coating the light emitting end surfaces 3 is completed, the heat resistant tape 16 is peeled off, and the submount 10 is subjected in a test step to the property and optical tests. Thereafter, the submount 10 is assembled in an assembling step to form the laser unit 20 shown in FIG. 6.

According to the invention, after a semiconductor laser chip is fixed to a submount and a wire bonding process is conducted, a surface electrode of the submount is covered by a tape, particularly a heat resistant tape. Under this state, a coating film is formed on the light emitting end surface. Consequently, the coating film is prevented from reaching the electrodes of the laser chip, and hence the laser chip is prevented from being faultily mounted on the submount and a faulty wire bonding is prevented from occurring.

Since a submount on which a semiconductor laser chip is mounted is used, the handling is facilitated. Furthermore, a plurality of such submounts are arranged so that their surface electrodes are aligned in a line, a heat resistant tape is applied to the submounts, and thereafter a coating film is formed on the light emitting end surface. Therefore, the present method is suitable for mass production.

What is claimed is:

1. A method of producing a semiconductor laser device, comprising the steps of:

fixing a semiconductor laser chip to a die bonding portion of a submount having a surface electrode;

connecting an electrode of said semiconductor laser chip to a wire bonding portion of said submount with a conductor;

covering the surface electrode of the submount; and thereafter forming a coating film on a light emitting end surface of said semiconductor laser chip.

2. The method according to claim 1, wherein the coating film forming step is conducted under a state where a plurality of submounts on each of which said semiconductor laser chip is mounted are arranged and surface electrodes of said submounts are covered.

3. The method according to claim 1, wherein the coating film forming step is conducted under a state where a plurality of submounts on each of which said semiconductor laser chip is mounted are arranged in a line and surface electrodes of said submounts are covered by a heat resistant tape.

4. The method according to claim 1, wherein the coating film forming step is conducted by a sputtering process.

5. The method according to claim 1, wherein the coating film forming step is conducted by an evaporation process.

* * * * *